(12) United States Patent
Kim et al.

(10) Patent No.: US 8,988,126 B2
(45) Date of Patent: Mar. 24, 2015

(54) APPARATUS AND METHOD FOR LATENCY CONTROL IN HIGH FREQUENCY SYNCHRONOUS SEMICONDUCTOR DEVICE

(75) Inventors: Si-Hong Kim, Kyoungki-do (KR); Sang-Sic Yoon, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 2151 days.

(21) Appl. No.: 11/198,596

(22) Filed: Aug. 4, 2005

(65) Prior Publication Data

US 2006/0145894 A1 Jul. 6, 2006

(30) Foreign Application Priority Data

Dec. 30, 2004 (KR) .................. 10-2004-0116449

(51) Int. Cl.
| | |
|---|---|
| G06F 1/04 | (2006.01) |
| G11C 29/02 | (2006.01) |
| G11C 7/22 | (2006.01) |
| G11C 11/4076 | (2006.01) |
| G11C 29/50 | (2006.01) |

(52) U.S. Cl.
CPC ............... *G11C 29/023* (2013.01); *G11C 7/22* (2013.01); *G11C 7/222* (2013.01); *G11C 11/4076* (2013.01); *G11C 29/02* (2013.01); *G11C 29/50012* (2013.01)
USPC .............................................. 327/291; 327/2

(58) Field of Classification Search
CPC .......... G11C 15/04; G11C 15/00; G11C 8/04; G11C 17/30982; G11C 7/02
USPC ............. 327/291, 261–290, 2–12; 365/233.1, 365/233.11–233.19, 233.5; 375/241
See application file for complete search history.

(56) References Cited

U.S. PATENT DOCUMENTS

| | | | |
|---|---|---|---|
| 3,449,726 A * | 6/1969 | Hattori et al. ................. 345/467 |
| 3,641,561 A * | 2/1972 | Osugi et al. .................... 345/41 |
| 6,580,287 B2 * | 6/2003 | Hsu et al. ......................... 326/32 |
| 6,762,974 B1 * | 7/2004 | Johnson et al. .......... 365/233.11 |
| 2003/0218921 A1 | 11/2003 | Schrogmeier et al. |
| 2004/0008566 A1 | 1/2004 | Song |
| 2004/0081013 A1 | 4/2004 | Lee et al. |
| 2004/0213074 A1 | 10/2004 | Johnson et al. |
| 2004/0251939 A1 | 12/2004 | Brox et al. |
| 2005/0040862 A1 * | 2/2005 | Jiguet et al. ....................... 327/3 |
| 2006/0048011 A1 * | 3/2006 | Dieffenderfer et al. ......... 714/38 |

FOREIGN PATENT DOCUMENTS

| | | |
|---|---|---|
| CN | 1499523 | 5/2004 |
| JP | 09-259080 | 10/1997 |
| JP | 2001-155484 | 6/2001 |
| JP | 2004-005821 | 1/2004 |
| WO | WO 2004/021352 | 3/2004 |

* cited by examiner

*Primary Examiner* — Diana J Cheng
(74) *Attorney, Agent, or Firm* — Blakely Sokoloff Taylor & Zafman

(57) ABSTRACT

An apparatus for controlling a latency in a synchronous semiconductor device. The apparatus includes a first counting block for counting a cycle of a first clock signal to thereby generate a first binary code; a second counting block for counting a cycle of a second clock signal to thereby generate a second binary code. The second clock signal is obtained by delaying the first clock signal by a predetermined delay amount, A code comparison block stores the second binary code in response to a command and compares the first binary code with the second binary code to thereby generate a latency control signal.

11 Claims, 8 Drawing Sheets

APPARATUS AND METHOD FOR LATENCY CONTROL IN HIGH FREQUENCY SYNCHRONOUS SEMICONDUCTOR DEVICE

FIELD OF THE INVENTION

The present invention relates to an apparatus and method for latency control in a semiconductor device; and, more particularly, to an apparatus and method for generating a latency control signal faster by reducing a signal delay in a synchronous semiconductor device in order to improve an operation speed of the synchronous semiconductor device operating at a high frequency.

DESCRIPTION OF THE PRIOR ART

In a synchronous semiconductor memory device, data is inputted or outputted in synchronization with a clock signal supplied from an external device. Thus, in a conventional system including a synchronous semiconductor memory device, a controller can set a predetermined timing of outputting valid data from the synchronous semiconductor memory device after inputting a command such as a read instruction into the synchronous semiconductor memory device.

The above predetermined timing of outputting valid data relates to a latency in the synchronous semiconductor memory device. In DRAM specifications, there are plural latencies as AC parameters in order to ensure that changes in output values and operation steps of DRAM occur at the accurate or right time. Persons skilled in the art will recognize that AC parameters, as used herein, represent parameters which can control, adjust or effect changes to the AC characteristics of the semiconductor device. AC characteristics are understood by persons skilled in the art to mean diverse characteristics related to the timing or waveform of input/output signals among other operational features of a semiconductor device. Particularly, a CAS latency, which is one of the AC parameters, means a period until a valid data is outputted in response to a read instruction after the read instruction is inputted to the synchronous semiconductor memory device. Herein, the unit of the CAS latency is one cycle of external clock signal, i.e., tCC. For example, when a CAS latency is 2, a data corresponding to a read instruction should be outputted to an external device after two cycles of the external clock signal from a timing of inputting the read instruction to the synchronous semiconductor memory device.

That is, if the synchronous semiconductor memory device receives a read instruction and an address, the synchronous semiconductor memory device senses data in response to the address and outputs the sensed data after a predetermined time, i.e., after cycles of the external clock signal corresponding to a predetermined value of the CAS latency.

For achieving the above described operation, the synchronous semiconductor memory device includes a latency control unit for generating preferred latency control signals which are used for normally performing operations of the synchronous semiconductor memory device under predetermined values of plural latencies, e.g., a CAS latency (CL), an additive latency (AL) and a write latency (WL).

FIG. 1 is a timing diagram describing operation for a latency control in a conventional synchronous semiconductor device operating at a low frequency. FIG. 1 shows a latency control operation in a case when one cycle of an external clock signal ECLK is over 5 nsec.

If a read command RD_CMD is inputted to the conventional synchronous semiconductor device at a predetermined rising edge of the external clock signal ECLK, an internal read control signal INT_READ is activated after a predetermined read delay time tREAD from the predetermined rising edge. The internal read control signal INT_READ is a kind of control signal for indicating that the conventional synchronous semiconductor device is operated in a read mode. The internal read control signal INT_READ is enabled in response to the inputted read command RD_CMD and, then, disabled after a predetermined time.

Furthermore, the conventional synchronous semiconductor device includes a delay locked loop block (hereinafter, referred to DLL) for outputting an output data DQ at a timing synchronized with the external clock signal ECLK. The delay locked loop block DLL generates a DLL clock signal CLK_DLL in response to the external clock signal ECLK. In detail, a phase of the DLL clock signal CLK_DLL leads that of the external clock signal ECLK because it should be configured such that a data output path where data outputted from a unit cell is transmitted has a predetermined delay amount.

Generally, a phase difference between the DLL clock signal CLK_DLL and the output data DQ is represented as a data output delay (hereinafter, referred to tDLL). Referring to FIG. 1, since the output data DQ is synchronized with the external clock signal ECLK, the data output delay tDLL can be considered as a timing difference between rising edges of the DLL clock signal CLK_DLL and the external clock signal ECLK.

In the convention synchronous semiconductor device operating at a low frequency as shown in FIG. 1, because the data output delay tDLL is shorter than one cycle of the external clock signal tCC, it is possible to prevent a phase of the DLL clock signal CLK_DLL from leading that of the internal read control signal INT_READ. If the CAS latency (CL) is 1, the output data DQ is latched at a rising edge of the DLL clock signal CLK_DLL during an activation period of the internal read control signal INT_READ and outputted through a data pin at a rising edge of the external clock signal ECLK during the activation period of the internal read control signal INT_READ. As a result, the output data DQ is synchronized with a next rising edge of the external clock signal ECLK, i.e., after one cycle from a read command input timing, e.g., a rising edge of the external clock signal ECLK when the read command RD_CMD is inputted.

Likewise, referring to FIG. 1, if the CAS latency (CL) is over 1, the output data DQ is latched at a rising edge of the DLL clock signal after a rising edge of CL-1 cycles from the read command input timing within the activation period of the internal read control signal INT_READ. That is, the internal read control signal INT_READ is activated at a timing which is shifted from the read command input timing by CL-1 cycles of the external clock signal ECLK and, then, the output data DQ is outputted after CL cycles of the external clock signal ECLK from the read command input timing. For instance, if the CAS latency (CL) is 2, the internal read control signal INT_READ is activated after one cycle from the read command input timing. After the internal read control signal INT_READ is activated, the output data DQ is latched at a rising edge of the DLL clock signal DLL_CLK. Herein, since the output data DQ is synchronized at two cycles from the read command input timing, it is satisfied that the CAS latency is 2.

As above mentioned, the latency control is not difficult in the conventional synchronous semiconductor device operating at a low frequency. However, as an operation speed of a synchronous semiconductor device is increased, i.e., the synchronous semiconductor device is operated at a higher frequency, latency control becomes more difficult.

FIG. 2 is a timing diagram describing operation for a latency control in another conventional synchronous semiconductor device under a high frequency. As shown, FIG. 1 shows a latency control operation in a case when one cycle of the external clock signal ECLK is below 5 nsec.

As the synchronous semiconductor device is operated at a higher frequency, the period of the external clock signal ECLK is shorter. On the other hand, the read delay time tREAD and the data output delay tDLL are not free to control regardless of the operation speed of the synchronous semiconductor device. Thus, in this case, a rising edge of the DLL clock signal DLL_CLK leads that of the internal read control signal INT_READ.

If the rising edge of the DLL clock signal DLL_CLK leads that of the internal read control signal INT_READ, the DLL clock signal DLL_CLK is delayed by a predetermined time in order to delay the internal read control signal INT_READ by a predetermined number of cycles of the external clock signal ECLK. Namely, the internal read control signal INT_READ is activated based on the delayed DLL clock signal DLL_CLK.

Referring to FIG. 2, there is described operation of the synchronous semiconductor device when the CAS latency (CL) is 4. For satisfying a condition that the CAS latency (CL) is 4, the synchronous semiconductor device additionally generates a first delayed clock signal clkoe10 and a second delayed clock signal clkoe20. Herein, the first delayed clock signal clkoe10 is internally generated by delaying the DLL clock signal CLK_DLL by a first delay time tDLY1, and the second delayed clock signal clkoe20 is internally generated by delaying the DLL clock signal CLK_DLL by a second delay time tDLY2. Then, the internal read control signal INT_READ is latched at a first rising edge of the first delayed clock signal clkoe10 to thereby generate a first output enable signal oe10 which is activated later than the internal read control signal INT_READ. The first output enable signal oe10 has the same period as the internal read control signal INT_READ.

For generating a second output enable signal oe20, the first output enable signal oe10 is latched at a second rising edge of the second delayed clock signal clkoe20. As a result, the second output enable signal having the same period with the first output enable signal oe10 is activated later than the first output enable signal oe10. Further, the second output enable signal oe20 is latched by the DLL clock signal CLK_DLL to thereby generate a latency control signal Late_con.

As a result, a period of the latency control signal Late_con is the same as that of the internal read control signal INT_READ. Also, the latency control signal Late_con has later predetermined cycles, e.g., three cycles 3 tCC of FIG. 2, than the internal read control signal INT_READ.

If an output data DQ is latched by the DLL clock signal CLK_DLL during an enable period of the latency control signal Late_con, the output data DQ is outputted in synchronization with the external clock signal ECLK after 4 clock cycles, i.e., CL=4, from a timing when a read command RD_CMD is inputted.

However, since above described latency control method delaying the internal read control signal INT_READ by a predetermined time starts after the internal read control signal INT_READ is generated, the latency control signal Late_con should be generated before a predetermined timing when the output data DQ is latched at the DLL clock signal CLK_DLL. Thus, as the CAS latency is increased, internal operation for generating the latency control signal Late_con is more complex and a delay amount between the latency control signal Late_con and the internal read control signal INT_READ is increased. As a result, under a high frequency operation the CAS latency is increased, and the delay amount is a critical limitation for increasing the operation speed of the synchronous semiconductor device.

SUMMARY OF THE INVENTION

It is, therefore, an object of the present invention to provide an apparatus and a method for improving a latency control in a synchronous semiconductor device in order to increase an operation speed of the synchronous semiconductor device.

In accordance with an aspect of the present invention, there is provided an apparatus for controlling a latency in a synchronous semiconductor device, including a first counting block for counting a cycle of a first clock signal to thereby generate a first binary code; a second counting block for counting a cycle of a second clock signal to thereby generate a second binary code, wherein the second clock signal is obtained by delaying the first clock signal by a predetermined delay amount; and a code comparison block for storing the second binary code in response to a command and comparing the first binary code with the second binary code to thereby generate a latency control signal.

In accordance with another aspect of the present invention, there is provided a method for controlling a latency in a synchronous semiconductor device, including the steps of: A) counting a cycle of a first clock signal to thereby generate a first binary code; B) counting a cycle of a second clock signal to thereby generate a second binary code, wherein the second clock signal is obtained by delaying the first clock signal by a predetermined delay amount; and C) storing the second binary code in response to a command and comparing the first binary code with the second binary code to thereby generate a latency control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, a semiconductor device according to the present invention will be described in detail referring to the accompanying drawings.

Figure 1:
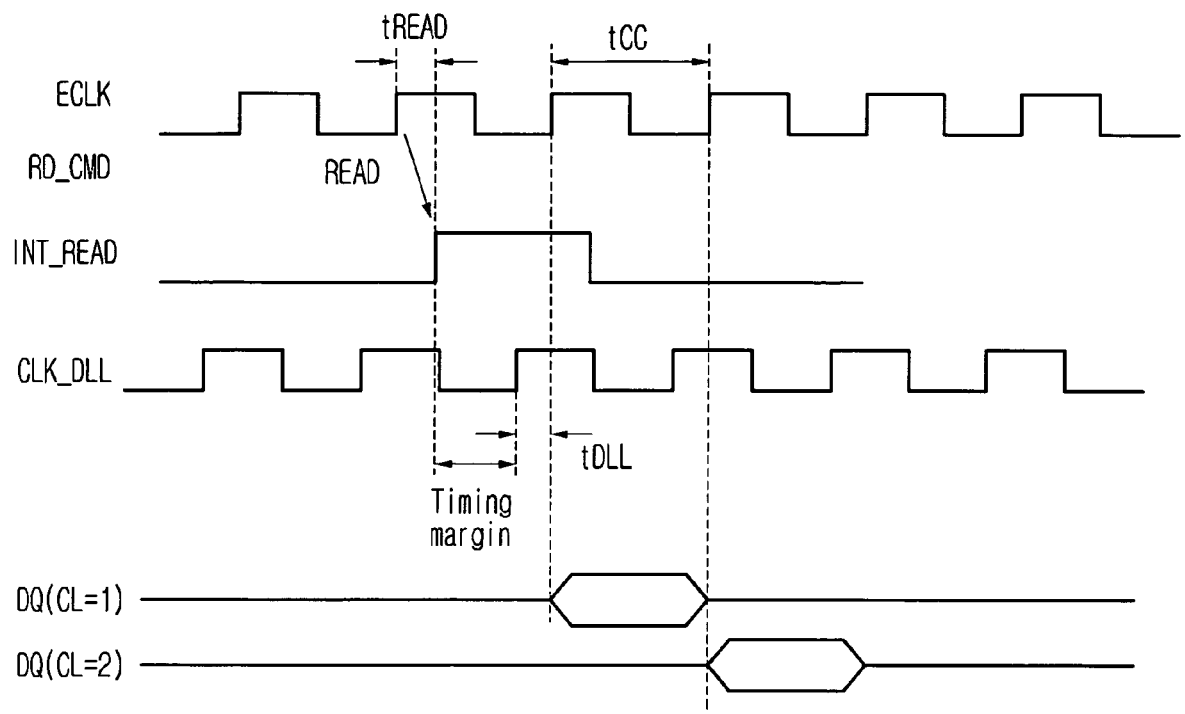
FIG. 1 is a timing diagram describing operation for a latency control in a conventional synchronous semiconductor device under a low frequency.
Figure 2:
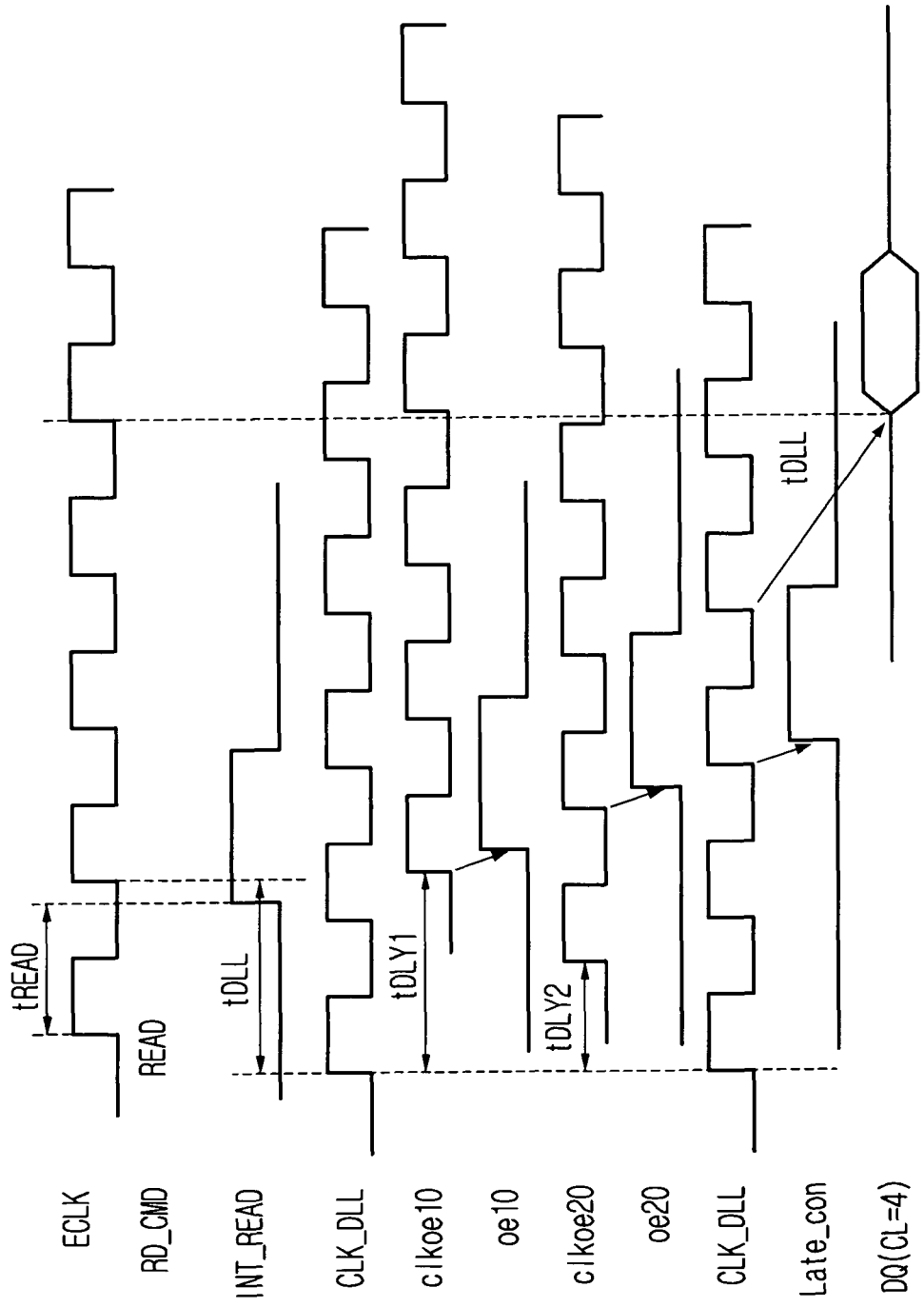
FIG. 2 is a timing diagram describing operation for a latency control in another conventional synchronous semiconductor device under a high frequency.
Figure 3:
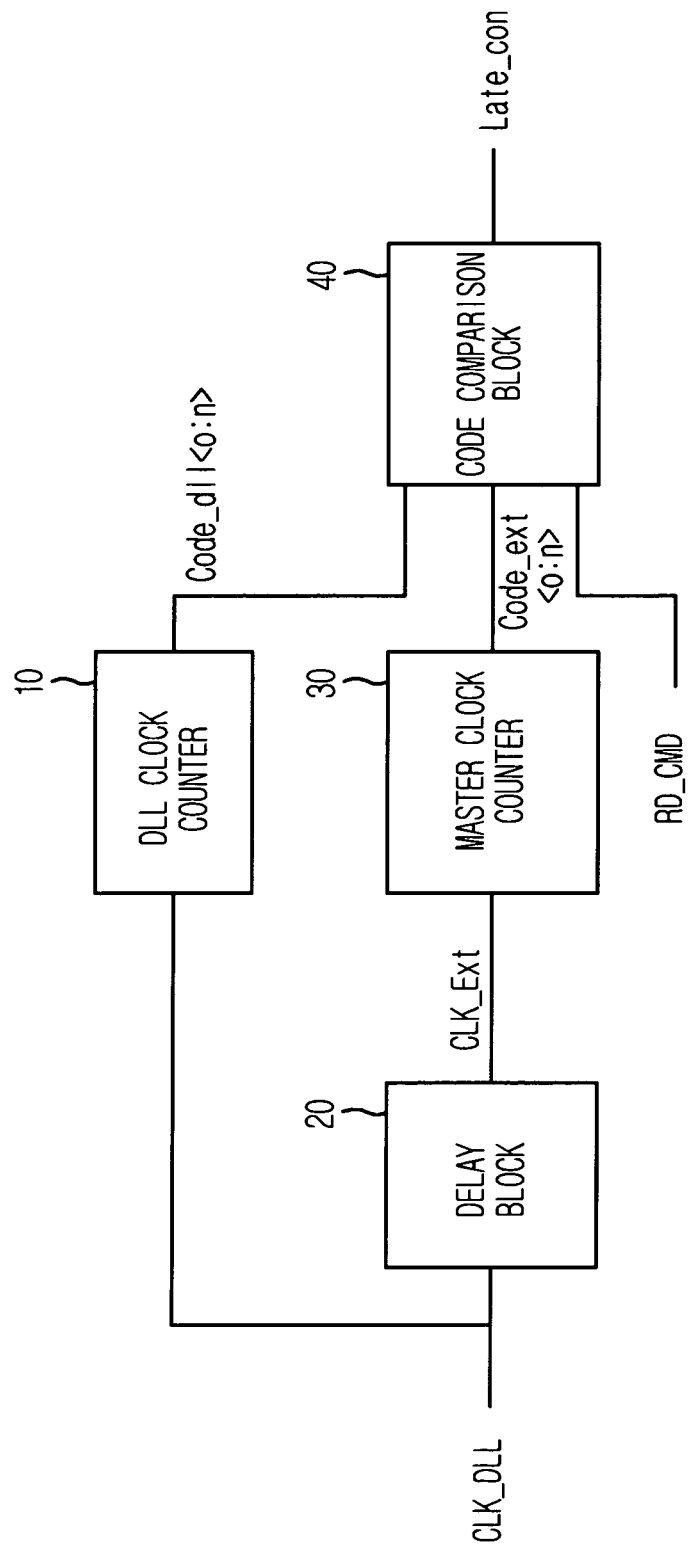
FIG. 3 is a block diagram showing a latency control unit in a synchronous semiconductor device in accordance with the present invention.

FIG. 3 is a block diagram showing a latency control unit in a synchronous semiconductor device in accordance with the present invention. The latency control unit of the present invention includes a DLL clock counter 10, a delay block 20, a master clock counter 30 and a code comparison unit 40.

The DLL clock counter 10 generates a first binary code Code_dll<0:n>, which is constituted with predetermined bits corresponding to a value obtained by counting a DLL output clock CLK_DLL from a Delay Locked Loop (DLL), to the code comparison unit 40. Herein, n is a positive integer.

The Latency control unit 20 delays the DLL output clock CLK_DLL by a replica delay to thereby generate a sampling master clock CLK_Ext; and outputs the sampling master clock CLK_Ext to the master clock counter 30.

The master clock counter 30 generates a second binary code Code_ext<0:n>, which is constituted with predetermined bits corresponding to a value obtained by counting the sampling master clock CLK_Ext, to the code comparison unit 40.

If a read command RD_CMD is inputted to the code comparison unit 40, the code comparison unit 40 saves the second binary code Code_ext<0:n> and compares the second binary code Code_ext<0:n> with the first binary code Code_dll<0:n> inputted from the DLL clock counter 10. If the first and the second binary codes Code_dll<0:n> and Code_ext<0:n> are the same, the code comparison unit 40 activates a latency signal Late_con.

Figure 4:
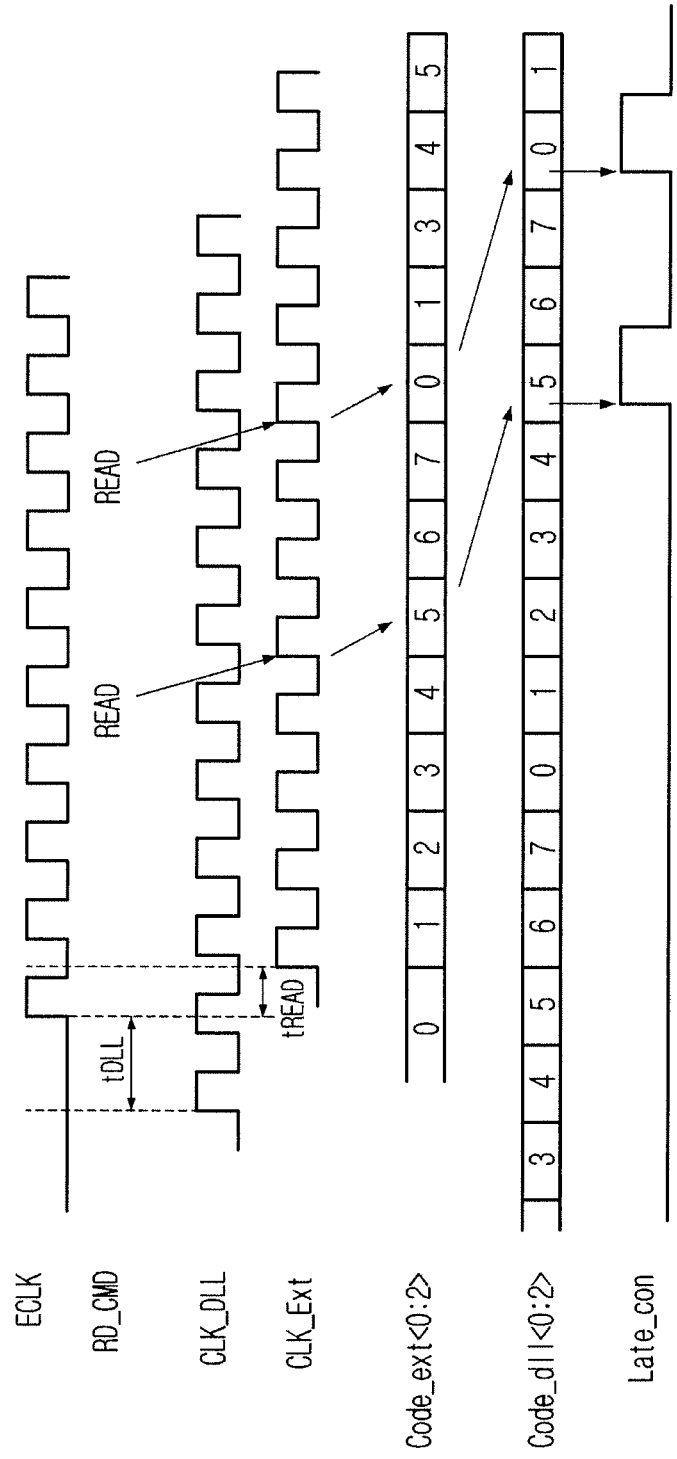
FIG. 4 is a timing diagram describing operation for the latency control unit shown in FIG. 3.

FIG. 4 is a timing diagram describing operation for the latency control unit shown in FIG. 3.

As shown, there are described the operation of the latency control unit according to the present invention when n is 2, i.e., the DLL clock counter 10 and the master clock counter 30 are respectively 3-bit binary counters. However, it is preferred that n is larger than the CAS latency (CL).

The DLL output clock CLK_DLL is generated from the DLL in order to synchronize outputted data signals with an external clock ECLK. A phase of the DLL output clock CLK_DLL leads that of the external clock ECLK by a data output delay tDLL. A period of the DLL output clock CLK_DLL is the same as that of the external clock ECLK.

The sampling master clock CLK_Ext lags against the external clock ECLK by a read delay time tREAD. Herein, the read delay time means a section from a timing of inputting a read command RD_CMD to a timing of generating an internal read control signal INT_READ (shown in FIG. 7). A period of the sampling master clock CLK_Ext is the same as that of the external clock ECLK.

The first and the second binary output codes, i.e., Code_dll<0:2> and Code_ext<0:2>, respectively outputted from the DLL clock counter 10 and the master clock counter 30 is a binary value which is initially determined by the CAS latency (CL) and circularly changed based on a predetermined order. That is, the DLL clock counter 10 and the master clock counter 30 are reset to each predetermined value before the DLL output clock CLK_DLL and the sampling master clock CLK_Ext are respectively inputted, wherein each predetermined value is varied according to the CAS latency (CL).

After the DLL clock counter 10 and the master clock counter 30 are reset, the output clock CLK_DLL is inputted to the DLL clock counter 10 and the delay block 20. The DLL clock counter 10 operates with the output clock CLK_DLL and counts a cycle number of the DLL output clocks CLK_DLL. Then, DLL clock counter 10 generates the first binary code Code_dll<0:2> corresponding to the counted cycle number to the code comparison unit 40.

The delay block 20 delays the DLL output clock CLK_DLL as much as a predetermined replica delay and outputs the sampling master clock CLK_Ext to the master clock counter 30. The master clock counter 30 counts a cycle number of the sampling master clocks CLK_Ext and outputs the second binary code Code_ext<0:2> corresponding to the counted cycle number to the code comparison unit 40.

Before the read command RD_CMD is inputted to the code comparison unit 40, the code comparison unit 40 always outputs the latency control signal Late_con having a logic low level regardless with the inputs of the first and the second binary codes, i.e., Code_dll<0:2> and Code_ext<0:2>. If the read command RD_CMD is inputted to the code comparison unit 40, the code comparison unit 40 saves the second binary code, e.g., Code_ext<0:2>='5' or '0' as shown in FIG. 4, at the earliest rising edge after the read command RD_CMD is inputted to the code comparison unit 40. The code comparison unit 40 compares the saved second binary code Code_ext<0:2> with the first binary code Code_dll<0:2> outputted from the DLL clock counter 10. If the first and the saved second binary codes Code_dll<0:2> and Code_ext<0:2> are the same, the latency control signal Late_con is activated to a logic high level.

Herein, even though the first and the second binary codes Code_dll<0:2> and Code_ext<0:2> are not the same, it is possible that the latency control signal Late_con is activated under predetermined specific conditions.

Figure 5:
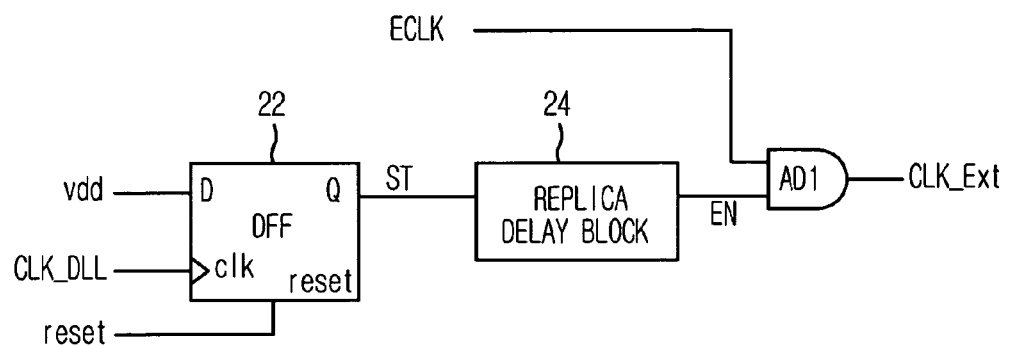
FIG. 5 is a block diagram depicting a delay block shown in FIG. 3.

FIG. 5 is a block diagram depicting the delay block 20 shown in FIG. 3.

The delay block 20 includes a D flip-flop 22, a replica delay unit 24 and a first AND gate AD1.

A supply voltage VDD is inputted to the input terminal D of the D flip-flop 22; and the DLL output clock CLK_DLL is inputted to the input clock clk of the D flip-flop 22. If the DLL output clock CLK_DLL is inputted to D flip-flop 22, the D flip-flop 22 outputs a D output signal ST, which has the same logic level as the input terminal D at a rising edge of the DLL clock signal DLL_CLK, to the replica delay unit 24.

The replica delay unit 24 outputs the enable signal EN, which is delayed as much as a replica delay from the D output signal ST of the D flip-flop 22, to the first AND gate AD1.

The AND gate AD1 performs a logic AND operation of the enable signal EN outputted from the replica delay unit 24 and the external clock ECLK to thereby generate the sampling master clock CLK_Ext.

Figure 6:
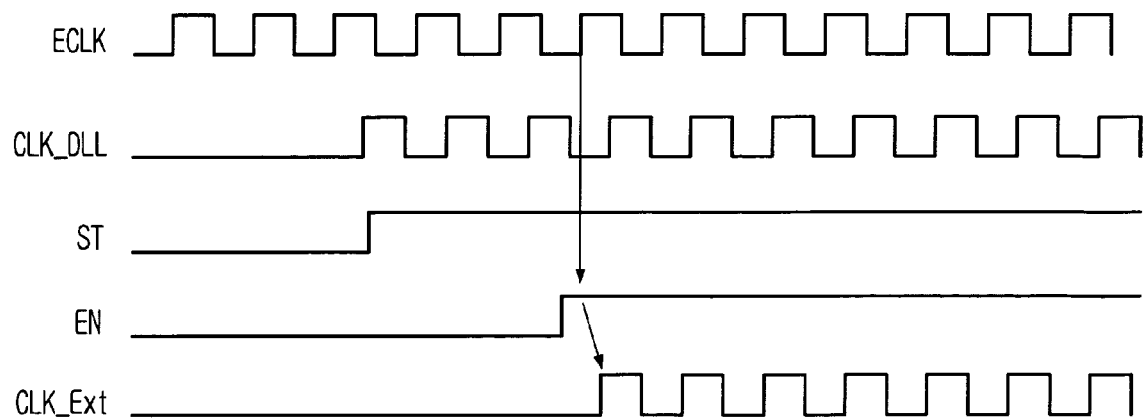
FIG. 6 is a timing diagram describing operation of the delay block shown in FIG. 5.

FIG. 6 is a timing diagram describing operation of the delay block 20 shown in FIG. 5.

If the output clock CLK_DLL is inputted to the D flip-flop 22 when the D flip-flop 22 is in a reset state, the D flip-flop 22 outputs a D output signal ST having a logic high level in synchronization with the first rising edge of the output clock CLK_DLL to the replica delay unit 24. The D output signal ST is delayed by the replica delay unit 24 and outputted as the enable signal EN. If the external clock ECLK is inputted while the enable signal EN is activated, the AND gate AD1 outputs the sampling master clock CLK_Ext based on a result of a logic AND operation between the enable signal EN and the external clock ECLK. As a result, the sampling master clock CLK_Ext has the same period as the external clock ECLK; and is outputted as a state lagging by the read delay time tREAD from the external clock ECLK.

Figure 7:
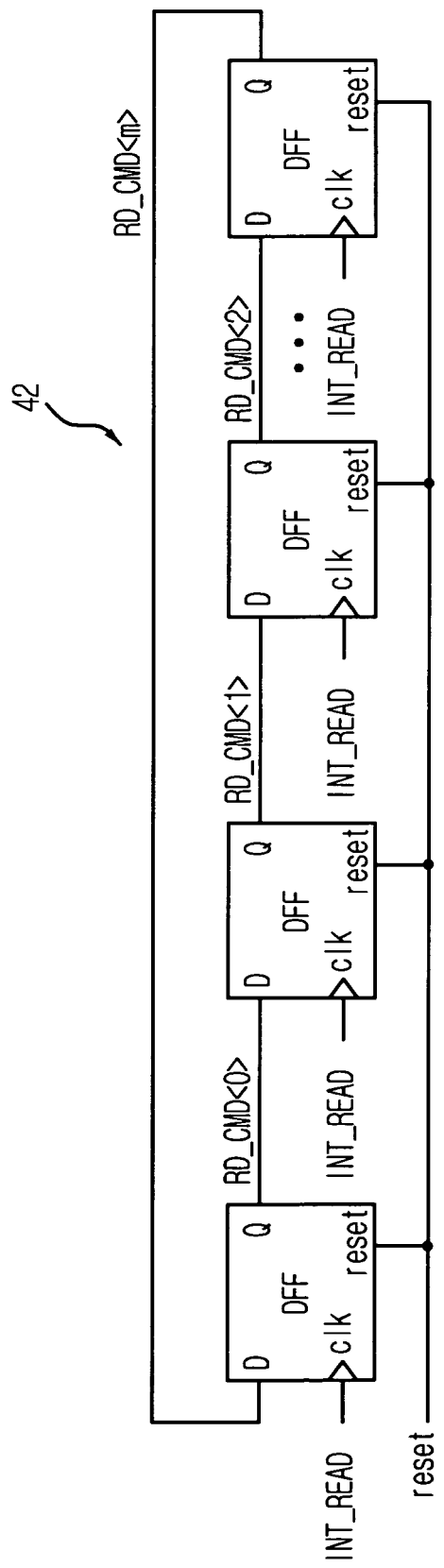
FIGS. 7 to 9 are schematic circuit diagrams showing a code comparison block shown in FIG. 3.
Figure 8:
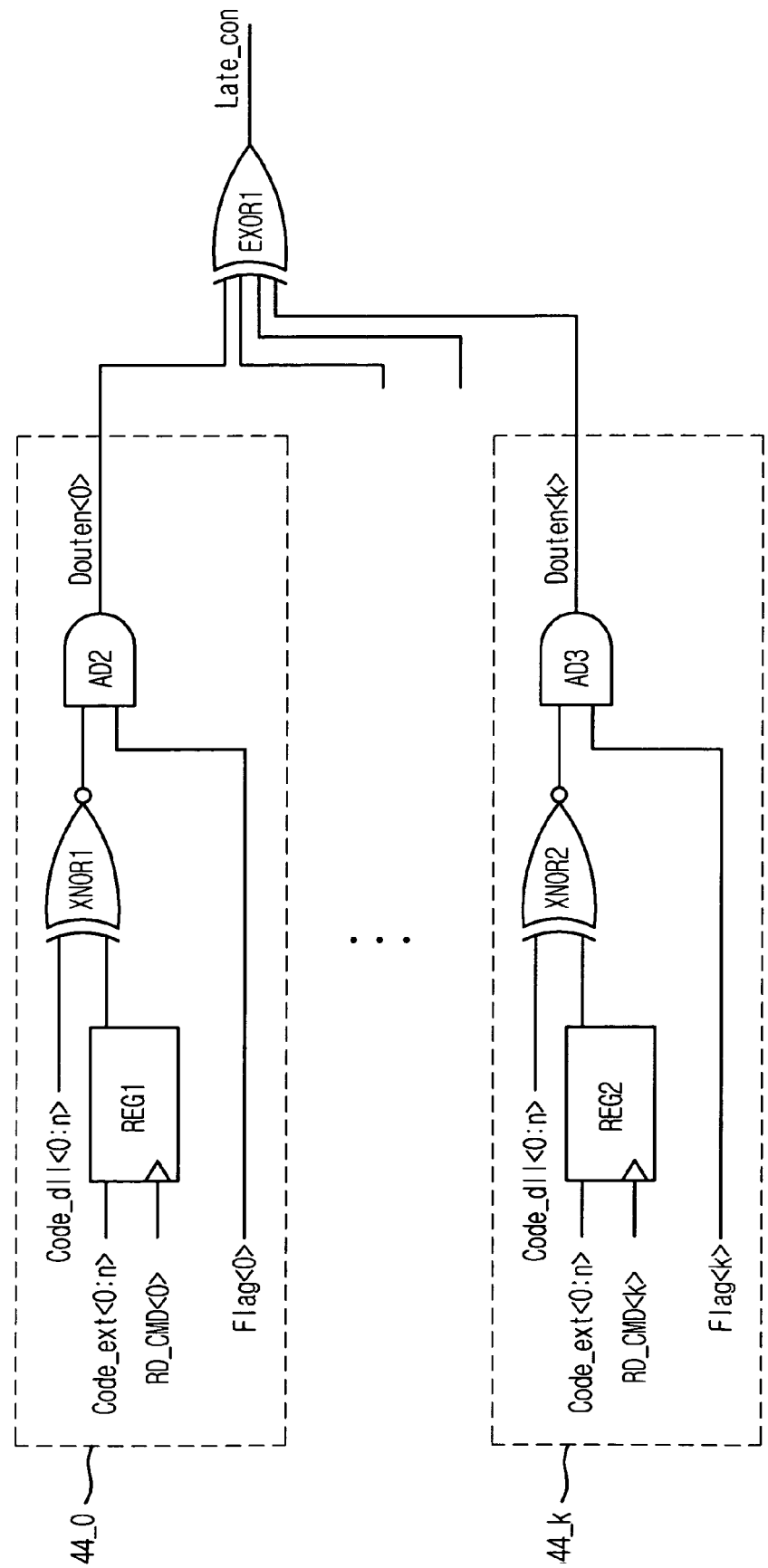
Figure 9:
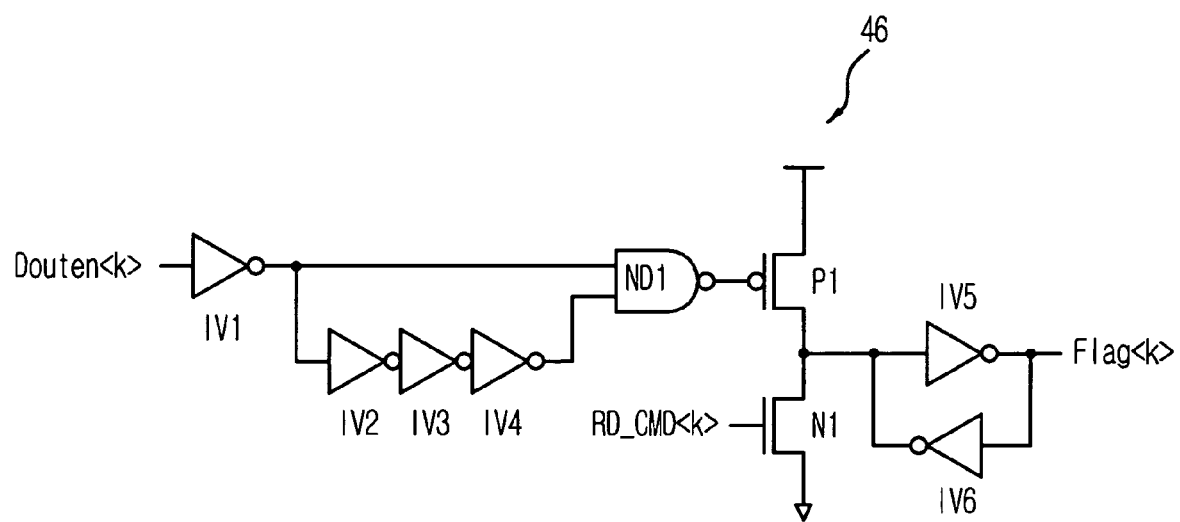

FIGS. 7 to 9 are schematic circuit diagrams showing a code comparison block 40 shown in FIG. 3.

The code comparison block 40 includes a shift register 42, a plurality of sub comparison units 44_0 to 44_k, a plurality of flag generating units, e.g., 46, and a first exclusive OR gate EXOR1.

The shift register 42 shown in FIG. 7 generates plural phase-controlled read commands RD_CMD<0> to RD_CMD<m>, each having a different phase, at every internal read control signal INT_READ. In order to generate the plural phase-controlled read commands RD_CMD<0> to RD_CMD<m>, the shift register 42 includes m+1 number of D flip-flops coupled to each other as shown in FIG. 7. Herein, m is a positive integer. That is, an input terminal of a first D flip-flop 42_0 is coupled with an output terminal of a (m+1)$^{th}$ D flip-flop 42_m, and an output of the first D flip-flop 42_0 is coupled with an input of a second D flip-flop 42_1. The above described connection method is applied to every D flip-flop in the shift register 42 of the present invention. Also, the internal read control signal INT_READ is inputted to every clock input of all D flip-flops 42_0 to 42_m.

Referring to FIG. 8, each sub comparison unit, e.g., 44_0 and 44_1, included in the code comparison block 40 compares the first binary code Code_dll<0:n> with the second binary code Code_ext<0:n> in response to the phase-controlled read commends, e.g., RD_CMD<0>, and flag signals, e.g., Flag<0> and Flag<k>. If the first and second binary codes Code_dll<0:n> and Code_ext<0:n> are the same, each sub comparison unit outputs a data output enable signal, e.g., Douten<0> and Douten<1>, activated as a logic high level.

Each sub comparison unit, e.g., 44_0, includes a register, e.g., REG1, a first exclusive NOR gate, e.g., XNOR1, and an AND gate, e.g., AD2. For instance, in a first sub comparison unit 44_0, the register REG1 temporarily saves the second binary code Code_ext<0:n> in response to the phase-controlled read command, e.g., RD_CMD<0>. If the first and the second binary codes, e.g., Code_ext<0:n> and Code_dll<0:n>, are the same, the first exclusive NOR gate XNOR1 outputs a logic high level signal to the AND gate AD2. The AND gate AD2 performs a logic AND operation between the output signal of the exclusive OR gate EXOR2 and the flag signal Flag<0> to thereby output the data output enable signal Douten<0>. Another sub comparison unit 44_k has the same structure with the sub comparison unit 44_0.

Referring to FIG. 9, the flag generating unit 46 outputs the flag signal Flag<k> based on a data output enable signal Douten<k> and a phase-controlled read command RD_CMD<k> in order to check a validity of the second binary code Code_ext<0:n>. Herein, k is an integer between 0 and m. The flag generating unit 46 includes plural inverters IV1 to IV6, a first NAND gate ND1, a first PMOS transistor P1, and a first NMOS transistor N1. The first inverter IV1 outputs a reversed signal of the data output enable signal Douten<k> to the second inverter IV2 and the first NAND gate ND1. The second to fourth inverters IV2 to IV4 are serially connected as an inverter chain. The inverter chain IV2 to IV4 delays and reverses the output signal of the inverter IV1. The first NAND gate ND1 performs a logic NAND operation between the output signals of the first inverter IV1 and the inverter chain IV2 to IV4.

The first PMOS transistor P1 and the first NMOS transistor N1 are serially connected between the supply voltage and the ground. The output signal of the NAND gate ND1 is inputted to the gate of the PMOS transistor P1; and the phase-controlled read command RD_CMD<k> is inputted to the gate of the NMOS transistor N1. The fifth and sixth inverters IV4 and IV5 are connected as an inverse latch. The inverters IV4 and IV5 reverse the signal obtained from the common node of the PMOS transistor P1 and the NMOS transistor N1 to thereby output the reversed signal as the flag signal Flag<k>.

The exclusive OR gate ENOR1 activates the latency control signal Late_con as a logic high level when one of the data output enable signals, e.g., Douten<0>, each outputted from the plurality of sub comparison units, e.g., 44_0, is a logic high level, i.e., the first and the second binary codes Code_dll<0:n> and Code_ext<0:n> compared in one of the plurality of sub comparison units are the same.

In the code comparison unit 40, if the read command RD_CMD is inputted to the code comparison unit 40, the prescribed code comparison unit 40 temporarily saves the second binary code Code_ext<0:n> in the register, e.g., REG1, of the sub comparison unit, e.g., 44_0. The code comparison unit 40 compares the first and the second binary codes Code_ext<0:n> and Code_dll<0:n> to thereby output the data output enable signal, e.g., Douten<0>, according to the comparison results. Herein, in response to the read command RD_CMD, the second binary code Code_ext<0:n> is saved in one among the plurality of sub comparison units selected by the shift register 42. Also, a corresponding register included in the selected sub comparison unit should be verified whether or not a valid second binary code Code_ext<0:n> is temporarily saved by using the flag signal, e.g., Flag<0>.

Referring to FIG. 9, the flag signal Flag<k> is enabled as a logic high level when the phase-controlled read command RD_CMD<k> is inputted as a logic high level; and disabled as a logic low level when the data output enable signal Douten<k> is activated as a logic high level.

As above described, the latency control unit in accordance with the present invention improves a latency control of a synchronous semiconductor device; and, particularly, generates a latency control signal faster by reducing a delay. Therefore, by using the latency control unit in accordance with the present invention, the synchronous semiconductor device can increase its operation speed.

The present application contains subject matter related to Korean patent application No. 2004-116449, filed in the Korean Patent Office on Dec. 30, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus for controlling a latency in a synchronous semiconductor device, comprising:
    a first counting block configured to count a cycle of a first clock signal output from a delay locked loop to generate a first binary code corresponding to a first counted cycle number;
    a delay block configured to delay the first clock signal by a predetermined delay amount and to generate a second clock signal;
    a second counting block configured to receive and count a cycle of the second clock signal to thereby generate a second binary code corresponding to a second counted cycle number; and
    a code comparison block configured to directly receive the first binary code from the counting block, the second binary code from the second counting block and a read command signal and to compare the first binary code with the second binary code in response to the read command signal to thereby generate a latency control signal used in the synchronous semiconductor device,
    wherein a phase of the first clock signal leads a phase of an external clock signal by a first period; and a phase of the second clock signal lags the phase of the external clock signal by a second period, and
    wherein the predetermined delay amount adds the first period and the second period, wherein the latency control signal is activated to a logic high level when the first binary code is identical to the second binary code,
wherein the first counting block and the second counting block are respectively set to a predetermined value based on a CAS latency before the first and the second clock signals are respectively inputted to the first and the second counting blocks.

2. The apparatus as recited in claim 1, wherein the first period is a time gap between the first clock signal and an output data outputted in response to the read command signal; and the second period is a time gap between the command and an internal command generated in response to the read command signal.

3. The apparatus as recited in claim 1, wherein the delay block includes:
a flip-flop for receiving the first clock signal to generate a start signal;
a replica delay for receiving the start signal to generate an enable signal by delaying the start signal by the predetermined delay amount; and
a logic gate for receiving the external clock and the enable signal to generate the second clock signal.

4. The apparatus as recited in claim 3, wherein the code comparison block includes:
a shift register for generating a plurality of internal data instructions, each having a different phase, in response to internal commands;
a plurality of sub comparison units, each for comparing the first binary code with the second binary code in response to a corresponding internal data instruction and a corresponding flag signal to activate a data enable signal if the first and the second binary codes are the same; and
a plurality of flag generators, each for generating the flag signal, which is used for checking a validity of the second binary code, in response to a corresponding internal data instructions and a corresponding data enable signals; and
a second logic gate for activating the latency control signal if at least one data enable signal is activated.

5. The apparatus as recited in claim 4, wherein the sub comparison unit includes:
a register for temporally storing the second binary code in response to the internal data instruction;
a third logic gate for activating an output signal if the first and the second binary codes are the same; and
a fourth logic gate for activating the data enable signal if the output signal and the flag signal are activated.

6. The apparatus as recited in claim 1 wherein the code comparison block stores the second binary code in response to a command.

7. A method for controlling a latency in a synchronous semiconductor device, comprising:
setting to two different predetermined values based on a CAS latency before first and second clock signals are respectively inputted to first and second counting blocks;
counting a cycle of the first clock signal to thereby generate a first binary code corresponding to a first counted cycle number;
delaying the first clock signal by the predetermined delay amount to generate the second clock signal;
counting a cycle of the second clock signal to thereby generate a second binary code corresponding to a second counted cycle number; and
receiving directly the first binary code, the second binary code and a read command signal and comparing the first binary code with the second binary code in response to the read command signal to thereby generate a latency control signal used in the synchronous semiconductor device,
wherein a phase of the first clock signal leads a phase of an external clock signal by a first period; and a phase of the second clock signal lags the phase of the external clock signal by a second period, and
wherein the predetermined delay amount adds the first period to the second period,
wherein the latency control signal is activated to a logic high level if the first binary code is identical to the second binary code.

8. The method as recited in claim 7, wherein the first clock signal, which is outputted from a delay locked loop, leads an external clock signal by a first period; and the second clock signal lags the external clock signal by a second period.

9. The method as recited in claim 8, wherein the first period is a time gap between the first clock signal and an output data outputted in response to a command; and the second period is a time gap between the command and an internal command generated in response to the command.

10. The method as recited in claim 7 further comprising storing the second binary code in response to a command.

11. An apparatus for controlling a latency in a synchronous semiconductor device, comprising:
a first counting block configured to count a cycle of a first clock signal output from a delay locked loop and to output a first binary code corresponding to a first counted cycle number;
a delay block configured to delay the first clock signal by a predetermined delay amount and to output a second clock signal;
a second counting block configured to receive and count a cycle of the second block signal and to output a second binary code corresponding to a second counted cycle number; and
a code comparison block configured to directly receive the first binary code from the first counting block, the second binary code from the second counting block and a read command signal and to compare the first binary code with the second binary code in response to the read command signal to thereby output a latency control signal used in the synchronous semiconductor device
wherein the first counting block and the second counting block are respectively set to two different predetermined values based on a CAS latency before the first and the second clock signals are respectively inputted to the first and the second counting blocks.

* * * * *